United States Patent
Palmer et al.

(10) Patent No.: US 6,539,609 B2
(45) Date of Patent: Apr. 1, 2003

(54) METHOD OF FORMING A HEAD GIMBAL ASSEMBLY

(75) Inventors: Darrell D. Palmer, San Jose, CA (US); A. David Erpelding, San Jose, CA (US); Oscar J. Ruiz, San Jose, CA (US); Surya Pattanaik, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/898,213

(22) Filed: Jul. 2, 2001

(65) Prior Publication Data

US 2001/0039716 A1 Nov. 15, 2001

Related U.S. Application Data (62) Division of application No. 08/643,935, filed on May 7, 1996, now Pat. No. 6,282,064, which is a continuation of application No. 08/365,123, filed on Dec. 27, 1994, now abandoned, which is a continuation-in-part of application No. 08/270,928, filed on Jul. 5, 1994, now abandoned, which is a continuation of application No. 08/613,287, filed on Mar. 11, 1996, now abandoned, which is a continuation of application No. 08/972,100, filed on Nov. 17, 1997, now Pat. No. 5,955,176.

(51) Int. Cl.[7] .............................. G11B 5/127; G11B 5/48
(52) U.S. Cl. ................. 29/603.03; 29/603.02; 29/603.06; 29/834; 29/832; 29/860; 360/234.5; 360/245.9
(58) Field of Search ........................... 29/603.1, 603.03, 29/603.02, 603.04, 603.05, 603.06, 737, 739, 832, 834, 860, 843, 840; 360/234.5, 244.1, 245.5, 245.8, 245.9, 244.3; 428/209, 901; 156/379.8

(56) References Cited

U.S. PATENT DOCUMENTS 4,594,221 A 6/1986 Caron et al. ................ 420/485
4,700,250 A * 10/1987 Kuriyama ................. 29/603.06

(List continued on next page.)

FOREIGN PATENT DOCUMENTS

| EP | 0 599 669 A2 | 6/1994 |
| JP | 60-246015 | 12/1985 |
| JP | 4-2196618 | 10/1992 |
| JP | 6-44530 | * 2/1994 |
| JP | 6-150597 | * 5/1994 |
| JP | 2001-34905 | * 2/2001 |

OTHER PUBLICATIONS

Anonymous disclosure, "Circuitized Suspension Flexture—"Foliage" for Disk Drives," Published in Research Disclosure, No. 339, Kenneth Mason Publications Ltd, England (Jul. 1992).

Cooper et al., "Constrained Layer Damper Spring Assemblies," IBM Technical Disclosure Bulletin, vol. 33, No. 8, pp. 373–374 (Jan. 1991).

(List continued on next page.)

*Primary Examiner*—A. Dexter Tugbang
(74) *Attorney, Agent, or Firm*—Donald J. Pagel (57) ABSTRACT

A method for forming a head gimbal assembly in which the head gimbal assembly and a frame are formed from a continuous piece of laminated material comprised of a first layer, a second layer and a third layer. A plurality of electrical lines are formed in the third layer of the head gimbal assembly and a plurality of electrical line extensions are formed in the third layer of the frame. The slider is positioned at an angle to the frame and a plurality of termination pads on the slider are bonded to the electrical lines. The frame is partially separated from the head gimbal assembly and the relative position of the slider to the head gimbal assembly is changed by an amount sufficient to separate the plurality of electrical lines from the plurality of electrical line extensions.

5 Claims, 8 Drawing Sheets

U.S. PATENT DOCUMENTS

| | | | | |
|---|---|---|---|---|
| 4,732,733 A | | 3/1988 | Sakamoto et al. | 420/485 |
| 4,866,836 A | * | 9/1989 | Von Brandt et al. | 29/603.06 |
| 4,996,623 A | | 2/1991 | Erpelding et al. | 360/245.9 |
| 5,026,434 A | | 6/1991 | Picault et al. | 148/685 |
| 5,145,553 A | * | 9/1992 | Albrechta et al. | 216/13 |
| 5,331,489 A | | 7/1994 | Johnson et al. | 360/234.5 |
| 5,334,346 A | | 8/1994 | Kim et al. | 420/4.85 |
| 5,424,030 A | | 6/1995 | Takahashi | 420/473 |
| 5,427,848 A | | 6/1995 | Baer et al. | 428/332 |
| 6,282,064 B1 | | 8/2001 | Palmer et al. | 360/245.9 |

OTHER PUBLICATIONS

Rogers Corporation, "FLEX–I–MID® Adhesiveless Laminate," Product Data Sheet (not dated).

Mitsui Toatsu Chemicals, Inc. "KOOL BASE®," Product Data Sheet, pp. 1–7 (not dated).

Ooyama et al., Magnetic Head Apparatus, English translation of Japanese Kokai, Document No. 5–182141, publication date Jul. 23, 1993, translated by Schreiber Translations, Inc. for United States Patent and Trademark Office, Washington, D.C., pp. 1–18 (Nov. 2000).

* cited by examiner

METHOD OF FORMING A HEAD GIMBAL ASSEMBLY

This is a divisional application of application Ser. No. 08/643,935, filed on May 7, 1996, now U.S. Pat. No. 6,282,064, which is a continuation of Ser. No. 08/365,123, filed on Dec. 27, 1994, now abandoned, which was a continuation-in-part of application Ser. No. 08/270,928, filed Jul. 5, 1994 now abandoned, which was continued as application Ser. No. 08/613,287 filed Mar. 11, 1996, now abandoned, which was continued as application Ser. No. 08/972,100 filed Nov. 17, 1997, now U.S. Pat. No. 5,955,176.

BACKGROUND OF THE INVENTION

1. Technical Field

The present invention relates to a head gimbal assembly for a magnetic disk file and more specifically to a head gimbal assembly formed from a laminated material in which the electrical lines are formed in one layer of the laminate.

2. Background Information

Magnetic recording disk files that utilize a transducer mounted on a slider for reading and/or writing data on at least one rotatable disk are well-known in the art. In such systems, the slider is typically attached to an actuator arm by a suspension system.

Many suspension systems (also called head gimbal assemblies) include a flexure that is positioned in some manner between the slider and the suspension. For example, R. Watrous, in U.S. Pat. No. 4,167,765, discloses a flexure that is added onto a stiffened member. Blaeser et. al, in U.S. Pat. No. 5,198,945, disclose another design that utilizes the material of the suspension as the flexure.

Figure 6:
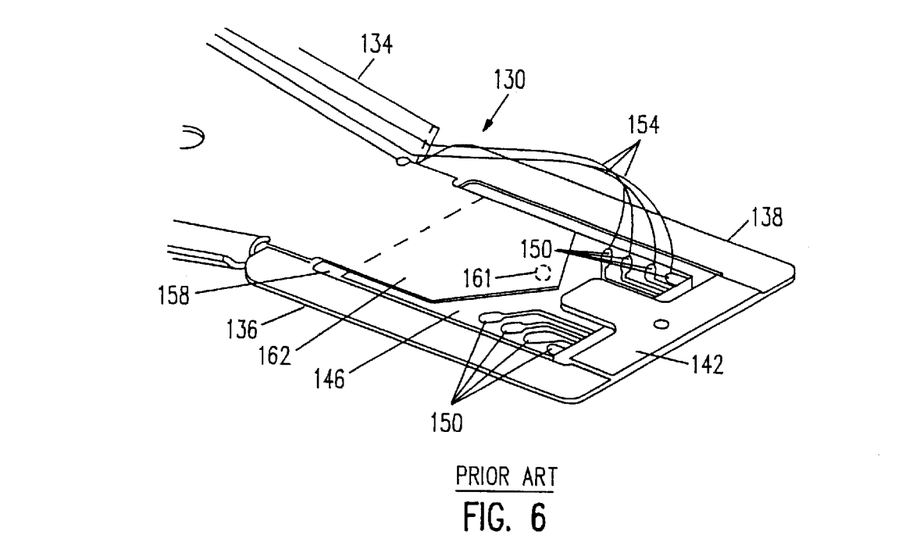
FIG. 6 is an isometric view of a head gimbal assembly according to the prior art.

Systems are known in which the slider is positioned in an open space formed between two flexure arms. For example, FIG. 6 illustrates a head gimbal assembly described by Johnson et al. in U.S. Pat. No. 5,331,489, in which the slider is positioned between two flexure arms and the electrical attachment to the slider is made by four discrete wires. The discrete wires are terminated to the back of the slider and four wires are utilized to accommodate magnetoresistive (MR) head technology.

The use of solder balls for attaching the slider to a slider support means is known in the art. For example, Ainslie et al., in U.S. Pat. No. 4,761,699, disclose the use of reflowed solder balls for making both the mechanical attachment of the slider to the suspension and the electrical connection of the transducer to the disk file read/write electronics. Additionally, Ainslie et al., in U.S. Pat. No. 4,789,914, disclose a soldering technique for making an electrical attachment of a cable to a transducer on the backside of a slider.

The use of laminated materials for constructing slider suspension systems is also known in the art. For example, Erpelding et al., in U.S. Pat. No. 4,996,623, disclose a suspension system comprised of a sheet of polyimide material sandwiched between two metal layers. U.S. Pat. No. 4,996,623 also discloses that a plurality of conductors can be formed in the copper layer of the suspension for providing electrical connections to the slider.

Additionally, the use of discrete layers for constructing the suspension is also known. For example, G. Oberg, in U.S. Pat. No. 4,819,094, discloses a suspension system in which flexible copper conductors are sandwiched between a pair of polyimide films.

BRIEF SUMMARY OF THE INVENTION

Briefly, the preferred embodiment of the present invention is a head gimbal assembly comprising a slider support member for holding a slider, a load beam for applying a load to the slider and an electrical cable extending along the backside of the load beam.

The head gimbal assembly is a single piece constructed from a laminated material comprised of a conductor layer, a dielectric layer and a support layer. The conductor layer is comprised of a high strength electrically conductive material such as a high strength copper alloy. The dielectric layer is comprised of an electrically insulating material such as a polyimide, Teflon or epoxy. The support layer is comprised of a more rigid material such as stainless steel, titanium or beryllium copper.

The electrical cable is positioned for connection to the backside of a slider and is comprised of the conductor and dielectric layers of the laminated material. The conductor layer is positioned on the dielectric layer and a plurality of elongated strips are formed in the conductor layer, with a space separating each of the elongated strips. The dielectric layer is positioned between the backside surface of the slider and the conductor layer, and between the backside surface of the load beam and the conductor layer, to prevent electrical shorting.

In other embodiments, the electrical lines extend along the backside or frontside of the load beam and are terminated to the trailing edge of the slider.

DETAILED DESCRIPTION OF THE INVENTION

Figure 1:
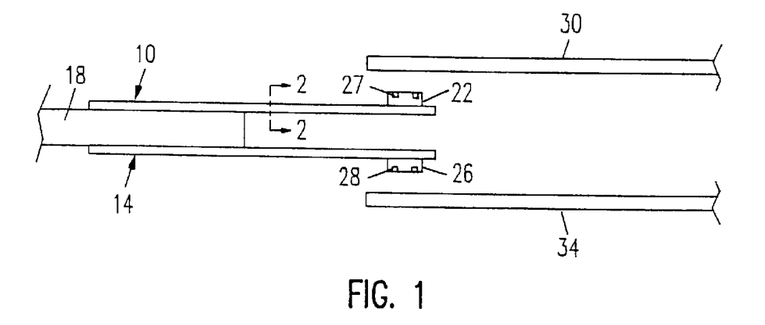
FIG. 1 is a schematic side view of a slider suspension system.

FIG. 1 is a schematic diagram of a first transducer suspension 10 and a second transducer suspension 14 attached to an actuator arm 18. The suspensions 10 and 14 are also referred to as head gimbal assemblies.

A first slider 22 is positioned at an end of the first transducer suspension 10 distally to the arm 18. A second slider 26 is positioned at an end of the second transducer suspension 14 distally to the arm 18. The slider 22 includes one or more data transducers 27 for reading and/or writing data on a magnetic medium such as a hard magnetic disk 30. Similarly, the slider 26 includes one or more data transducers 28 for reading and/or writing data on a magnetic medium such as a hard magnetic disk 34.

Figure 2:
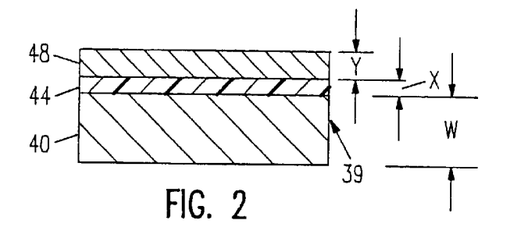
FIG. 2 is a cross-sectional view of the slider suspension system taken along the line 2—2 of FIG. 1.

FIG. 2 is a cross-sectional view of the first transducer suspension 10 illustrating that the suspension 10 is a multilayered laminate 39 comprised of a first layer 40, a second layer 44 and a third layer 48. The first layer 40 is positioned adjacent to one surface of the second layer 44. The third layer 48 is positioned adjacent to a different surface of the second layer 44 so that the second layer 44 separates the first layer 40 and the third layer 48, with the layers 40, 44 and 48 all lying in planes that are parallel to each other. The layers 40, 44 and 48 are generally secured together by a thin adhesive layer applied between layers 40 and 44 and between layers 44 and 48.

Representative dimensions and compositions for the various elements illustrated in FIG. 2 are as follows: In the preferred embodiment, the first layer 40 has a thickness "w" of approximately 0.051 millimeters and comprises full hard 301, 302 or 304 stainless steel. In more general terms, the first layer 40 has a thickness "w" of approximately 0.076 millimeters, or less, and comprises a rigid material such as stainless steel. Typically, the first layer 40 comprises 300 series stainless steel, but other stainless steels and other rigid materials could also be used (e.g. beryllium copper or titanium).

In the preferred embodiment, the second layer 44 comprises a polyimide that has properties similar to the properties of Kapton® E brand polyimide manufactured by E.I. Du Pont de Nemours and Company ("Dupont"), including a dielectric constant in the range of approximately 3.0 to 3.5. Additionally, the coefficient of thermal expansion (CTE) of the polyimide should be such that the laminate 39 will be in a neutral stress condition after the laminate 39 is manufactured. A neutral stress condition means that the laminate 39 will remain flat after manufacturing and will not curl up after either the first layer 40 or the third layer 48 are etched. Furthermore, the adhesive used to secure the layers 40, 44 and 48 together should be sufficiently robust to keep the laminate 39 intact up to a temperature of approximately 350° C.

In the preferred embodiment, the second layer 44 has a thickness "x" of approximately 0.0165 millimeters. This thickness is chosen because a thin layer 44 is needed to keep the stiffness of the suspension 10 low, but the price of polyimide films thinner than 0.0165 millimeters is a limiting consideration.

Rogers Corporation (Circuit Materials Unit), of Chandler, Ariz., supplies a laminate 39 having a second layer 44 that meets the specifications listed above. In ordering the laminate 39, the desired material for the third layer 48, such as one of the alloys described below, is provided to Rogers Corporation along with the specifications for the first layer 40, the second layer 44 and the third layer 48. Rogers Corporation then prepares a suitable laminate using proprietary methods.

In the Rogers laminate, the second layer 44 comprises a 0.0165 millimeter polyimide layer (layer 44) which is thought to be the same polyimide (or a similar polyimide) as is used in the Kool Base® brand material manufactured by Mitsui Toatsu Chemicals, Inc. In the Kool Base polyimide, a thin layer of adhesive is applied to each side of the polyimide layer for bonding the layer 44 to the layers 40 and 48.

A substitute for the Rogers laminate is a laminate custom manufactured by Dupont having a 0.0165 millimeter layer of Dupont's EKJ self-adhering polyimide composite (Kapton® E brand polyimide manufactured by Dupont) and meeting the other specifications listed above for the second layer 44.

Stated more generally, the second layer 44 has a thickness "x" of approximately 0.018 millimeters or less, and comprises a dielectric material such as a polyimide having a dielectric constant in the range of approximately 3.0 to 3.5 and a coefficient of thermal expansion (CTE) which allows the laminate 39 to be in a neutral stress condition after the laminate 39 is manufactured.

Polyimides of the types described in U.S. Pat. Nos. 4,839,232, 4,543,295 and 5,298,331 are potentially useful as the second layer 44, although the suitability of a specific polyimide for a particular purpose should be verified. Additionally, Teflon compounds of the formula $F(CF_2)_nF$ are also suitable for use in the second layer 44, as are nonconductive epoxies and other dielectric materials.

In the preferred embodiment, the third layer 48 has a thickness "y" of approximately 0.0178 millimeters and comprises a copper-nickel-silicon-magnesium alloy such as the copper alloy C7025 with a TMO3 temper (full hard heat temper) manufactured by Olin Brass (composition 96.2% Cu; 3% Ni; 0.65% Si; and 0.15% Mg).

Examples of other specific materials that can function as the third layer 48 include the following: 1. a high strength beryllium copper alloy (composition: 97.2–98.4% Cu; 0.2–0.6% Be; and 1.4–2.2% Ni, such as Brush Wellman beryllium copper alloy 3 (C17510) with an HT temper); 2. a high strength brass alloy (composition: 97.5% Cu; 2.35% Fe; 0.03% P;: and 0.12% Zn, such as Olin Brass copper alloy C194 with an ex. spring temper); 3. a high strength titanium copper alloy (composition: 96.1–96.6% Cu; and 2.9–3.4% Ti, such as Nippon Mining titanium copper alloy with a TiCuR1-EHM temper).

Stated more generally, the third layer 48 comprises a high strength electrically conducting material and has a thickness "y" of approximately 0.018 millimeters or less. For purposes of the present invention, the term "high strength" refers to a material with a tensile yield strength (Sy) greater than 70 ksi (kilopounds per square inch) and which doesn't soften by more than 10% when exposed to a temperature of 300° C. for one hour.

Figure 3:
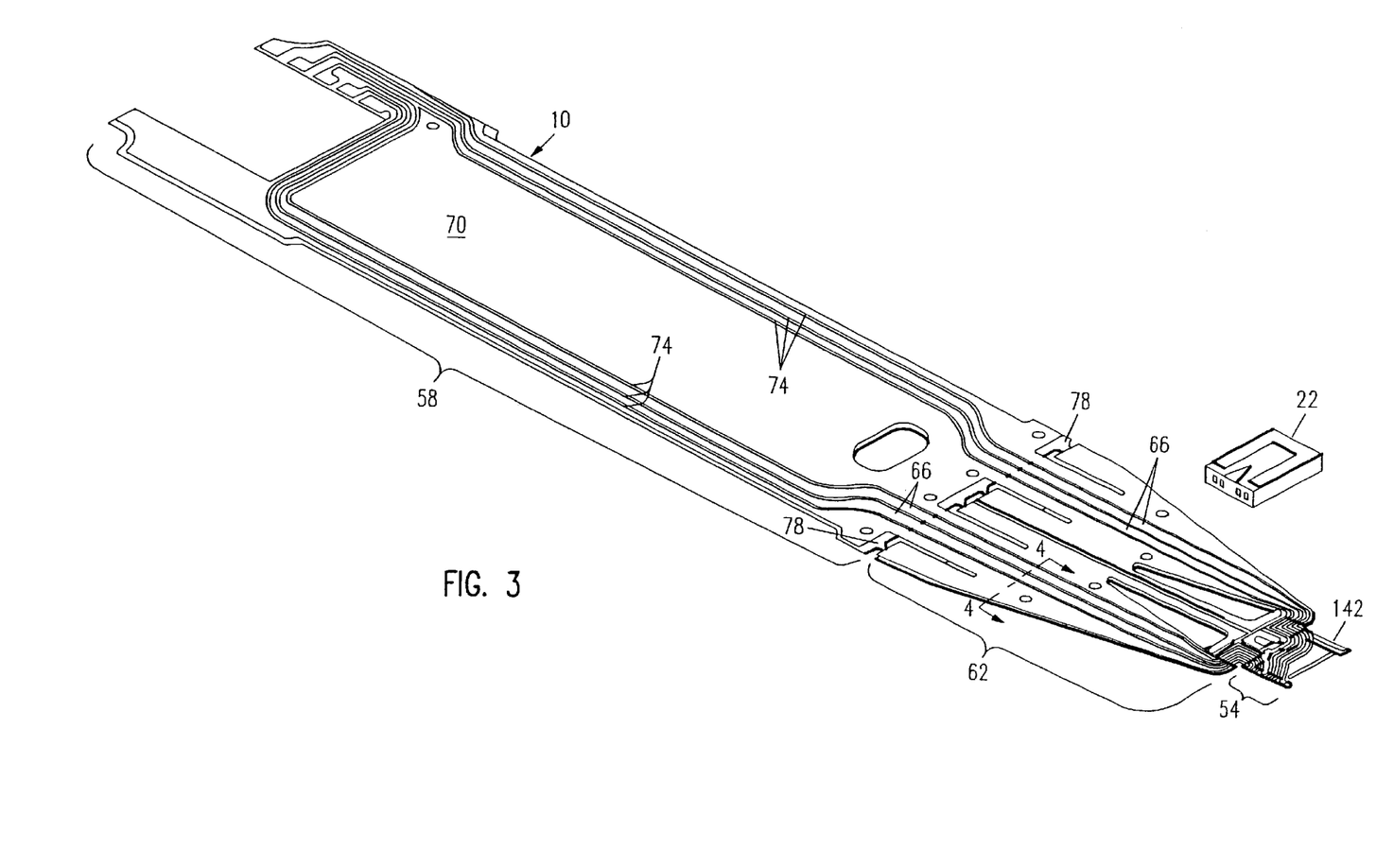
FIG. 3 is an isometric view of a slider suspension system.

FIG. 3 is a top view of the first transducer suspension 10. The suspension 10 has a slider portion 54, an arm portion 58 and a link portion 62 (also referred to as a load beam). A plurality of electrical lines 66 are present on a surface 70 of the system 10. Each electrical line 66 has a space 74 positioned along each of its sides so as to prevent the electrical line 66 from shorting out with an adjacent electrical line 66.

A plurality of hinges 78 are also shown in the surface 70. The hinges 78 are regions in which the third layer 48 has been removed to form channels in the third layer 48. The hinges 78 increase the flexibility of the suspension 10 and/or permit the suspension 10 to be bent at some predetermined angle. Similarly, hinges can also be formed by etching channels in the first layer 40.

Figure 4:
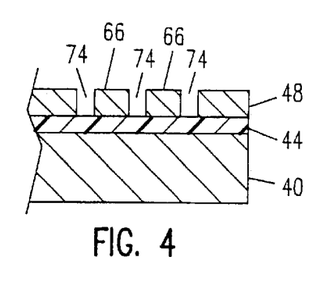
FIG. 4 is a cross-sectional view of the slider suspension system taken along the line 4—4 of FIG. 3.

The portions 54, 58 and 62 designate regions of the suspension 10, but the suspension 10 is preferably formed from one continuous piece of laminated material as is explained herein with respect to FIGS. 2 and 4.

The slider portion 54 is the part of the suspension 10 on which the read/write slider 22 is mounted. The electrical lines 66 form the electrical connections for connecting the slider 22 and the transducer 27 to an external system as is explained later with respect to FIG. 5.

The arm portion 58 is the part of the suspension 10 that is connected to the actuator arm 18. Typically, the arm portion 58 is attached to the actuator arm 18 by bonding, welding, swaging or screwing the arm portion 18 to the actuator arm along the first layer 40 shown in FIG. 2.

The link portion 62 connects the arm portion 58 to the slider portion 54. The suspension 14 is identical to the suspension 10 and includes all of the elements shown in FIG. 3, including the portions 54, 58 and 62 and the electrical lines 66.

FIG. 4 is a cross-sectional view of the suspension 10 illustrating that the electrical lines 66 are regions of the third layer 48 that are roughly rectangular in cross section, and that are separated from each adjacent electrical line 66 by one of the spaces 74. The spaces 74 extend down to the second layer 44 so that the second layer 44 is exposed through the space 74.

The electrical lines 66 are formed by etching the surface 70 using standard metal etching techniques. For example, when the third layer 48 comprises one of the copper alloys described above, the layer 48 is etched with ferric chloride or other suitable etchants. The etching process removes metal from specified regions, thereby forming the spaces 74 that define the electrical lines 66. In practice, a typical chemical etching process will not form a groove having the perfect rectangular shape illustrated in FIG. 4 for the spaces 74. Actual grooves formed by a chemical etching process are slightly rounded or tapered as is well-known in the art. In general, features such as the electrical lines 66, the spaces 74 and the hinges 78 are formed directly on the third layer 48 using photolithographic processes or by using numerically controlled imaging such as laser machining.

In the preferred embodiment, the first, second and third layers 40, 44 and 48 initially comprise a continuous sheet of laminated material of stainless steel/polyimide/copper alloy laminate. A plurality of slider suspension systems 10 are then manufactured from the sheet of laminate using the techniques described above.

A general procedure for the preparation of the metal-polyimide laminated material is described by St. Clair et al. in U.S. Pat. No. 4,543,295 (issued Sep. 24, 1985).

Figure 5:
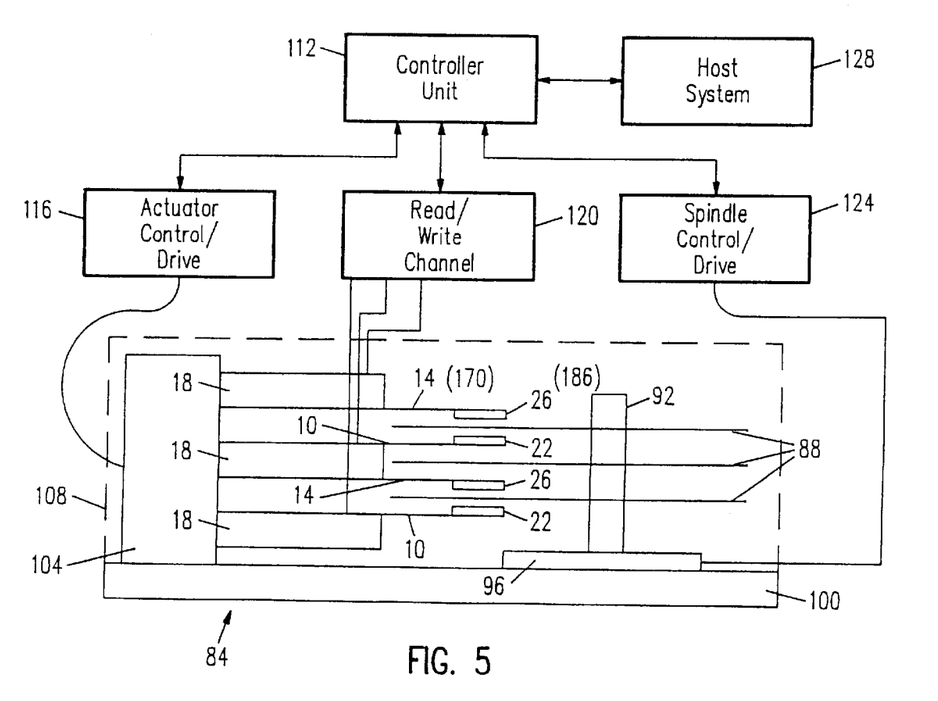
FIG. 5 is a schematic diagram of a disk file that utilizes a slider suspension system.

FIG. 5 is a schematic diagram of a magnetic recording disk file 84 that utilizes the transducer suspension system 10 of the present invention. It should be appreciated that the suspension system 14 is identical to the suspension system 10 so that the following comments apply equally to either the suspension system 10 or the suspension system 14. It should also be appreciated that the suspension systems 10 and 14 could be used with other data storage systems, such as floppy disk drives, optical drives or compact disk players.

The disk file 84 comprises a plurality of magnetic recording disks 88 suitable for use in hard disk drives. The disks 88 are mounted on a spindle shaft 92 which is connected to a spindle motor 96. Motor 96 is mounted to a chassis 100.

The plurality of read/write sliders 22 and 26 are positioned over the disks 88 such that each disk 88 can be accessed by one of the sliders 22 or 26. Each of the sliders 22 and 26 includes a transducer for reading and writing data on a plurality of concentric data tracks on the disks 88 and are attached to one of the suspension systems 10 (or 14). Each of the suspension systems 10 (or 14) are attached to the actuator arm 18 which is attached to a rotary actuator 104. The rotary actuator 104 moves the actuator arm 18 (and hence the suspension system 10 or 14 and the sliders 22 or 26) in a radial direction across the disk 88. An enclosure 108 (shown by a dashed line in FIG. 5) seals the disk file 84 and provides protection from particulate contamination.

A controller unit 112 provides overall control to the system 84. The controller unit 112 contains a central processing unit (CPU), memory unit and other digital circuitry and is connected to an actuator control/drive unit 116 which in turn is electrically connected to the actuator 104. This allows the controller 112 to control the movement of the sliders 22 and 26 over the disks 88. The controller 112 is electrically connected to a read/write channel 120 which in turn is electrically connected to the sliders 22 and 26. This allows the controller 112 to send and receive data from the disks 88. The controller 112 is electrically connected to a spindle control/drive unit 124 which in turn is electrically connected to the spindle motor 96. This allows the controller 112 to control the rotation of the disks 88. A host system 128, which is typically a computer system, is electrically connected to the controller unit 112. The host system 128 may send digital data to the controller 112 to be stored on the disks 88, or may request that digital data be read from the disks 88 and sent to the system 128. The basic operation and structure of data storage systems, such as the disk file 84 (without the suspension systems 10 or 14), is well-known in the art and is described in more detail in *Magnetic Recording Handbook*, C. Dennis Mee and Eric D. Daniel, McGraw-Hill Book Company (1990).

FIG. 6 is an isometric view of a head gimbal assembly 130 (HGA 130) according to the prior art. The HGA 130 includes a load beam 134 and a pair of flexure arms 136 and 138. The flexure arms 136 and 138 are joined at a slider portion 142. A slider 146 is attached to the slider portion 142. The slider 146 is a conventional magnetoresistive (MR) slider having an air bearing surface and a backside surface which is on the opposite side of the slider 146 from the air bearing surface. A plurality of read/write termination pads 150 are positioned on the backside of the slider 146 and a plurality of discrete wires 154 are connected to the termination pads 150 for electrically connecting a pair of head transducers (such as the transducers 27 and 28 shown in FIG. 1) to a read/write channel (such as the read/write channel 120 shown in FIG. 5).

The slider 146 is positioned in a cavity 158 that is formed between the flexure arms 136 and 138. The backside of the slider 146 is attached to the slider portion 142 and rests on a dimple 161 positioned on a support 162 which is an end of the load beam 134 that extends under the slider 146. The flexure arms 136 and 138 are extensions of the load beam 134 which have less thickness than the load beam 134. A more thorough description of the HGA 130 can be found in U.S. Pat. No. 5,331,489.

Figure 7:
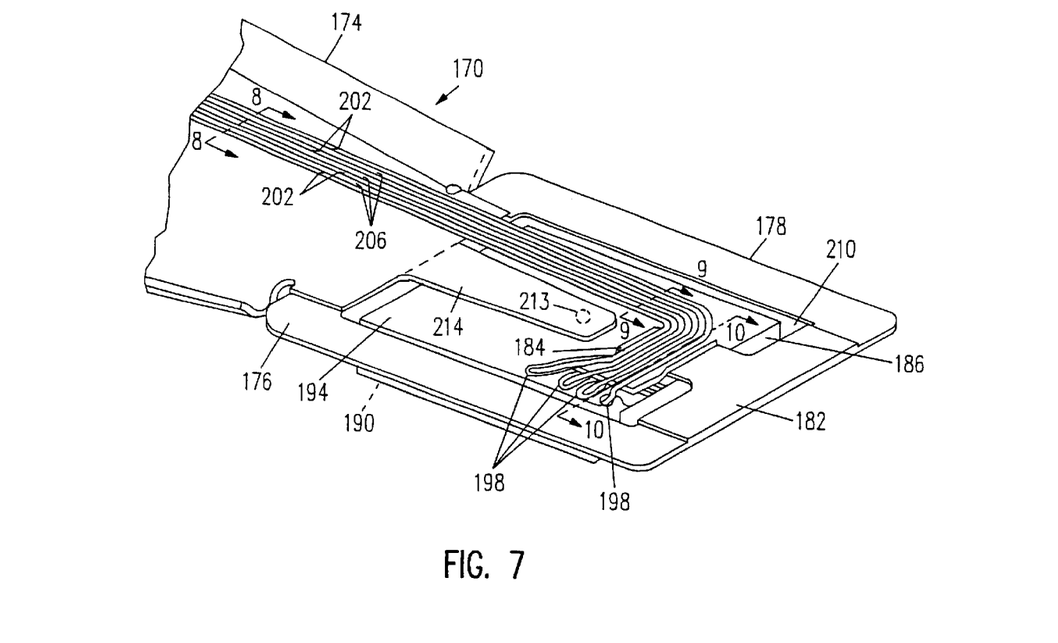
FIG. 7 is an isometric view of a head gimbal assembly according to the present invention.

FIG. 7 is an isometric view of a head gimbal assembly 170 (HGA 170) according to the present invention. The HGA 170 includes a load beam 174 and a pair of flexure arms 176 and 178. The flexure arms 176 and 178 are joined at a slider portion 182. The slider portion 182 includes a tab 184. A slider 186 is attached to the tab 184, typically by a layer of epoxy 188 positioned between the slider 186 and the tab 184 (see FIG. 10). The slider 186 is a conventional magnetoresistive (MR) slider having an air bearing surface 190 and a backside surface 194 which is on the opposite side of the slider 186 from the air bearing surface 190.

A plurality of read/write termination pads 198 are positioned on the backside surface 194. A plurality of electrical lines 202 are connected to the termination pads 198 for electrically connecting a pair of head transducers (such as the transducers 27 and 28 shown in FIG. 1) to a read/write channel (such as the read/write channel 120 shown in FIG. 5). Typically, the electrical lines 202 are connected to the termination pads 198 by ultrasonic bonding. A plurality of spaces 206 are positioned between the electrical lines 202 to prevent the electrical lines 202 from contacting each other.

The slider 186 is positioned in a cavity 210 that is formed between the flexure arms 176 and 178. The backside surface 194 is attached to the slider portion 182 and rests on a dimpled area 213 formed on a support 214 (i.e. the dimpled area 213 is a raised area positioned between the backside surface 194 and the support 214). The support 214 is an end of the load beam 174. The flexure arms 176 and 178 are extensions of the load beam 174 which have less thickness than the load beam 174. In the preferred embodiment, the load beam 174 is comprised of stainless steel and the flexures 176 and 178 are formed by chemically etching the stainless steel to reduce its thickness.

Figure 8:
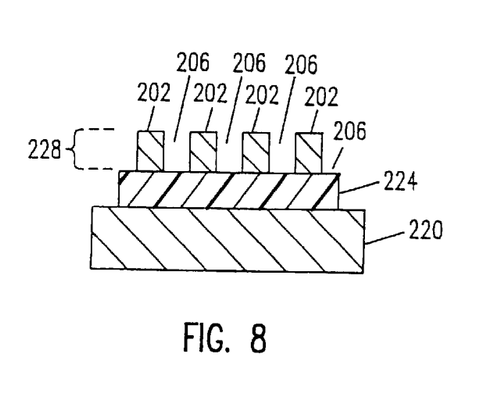
FIG. 8 is a cross-sectional view of the head gimbal assembly taken along the line 8—8 of FIG. 7.

FIG. 8 is a cross-sectional view of the HGA 170 illustrating that where the electrical lines 202 overlap the load beam 174, the HGA 170 is a multilayered structure comprised of a first layer 220 analogous to the first layer 40, a second layer 224 analogous to the second layer 44 and a third layer 228 analogous to the third layer 48. The dimensions and compositions of the layers 220, 224 and 228 are identical to those previously described for the layers 40, 44 and 48 with respect to FIG. 2. However, in the HGA 170, the layers 220, 224 and 228 are oriented so that the third layer 228 is facing away from the side of the disk 88 over which the slider 186 is flying.

FIG. 8 also illustrates that the electrical lines 202 are regions of the third layer 228 that are roughly rectangular in cross section, and that are separated from each adjacent electrical line 202 by one of the spaces 206. The spaces 206 extend down to the second layer 224 so that the second layer 224 is exposed through the space 206. One of the spaces 206 is positioned along each side of an electrical line 202 so as to prevent the electrical line 202 from shorting with an adjacent electrical line 202. The electrical lines 202 are formed in the same manner as was previously described for the electrical lines 66.

Figure 9:
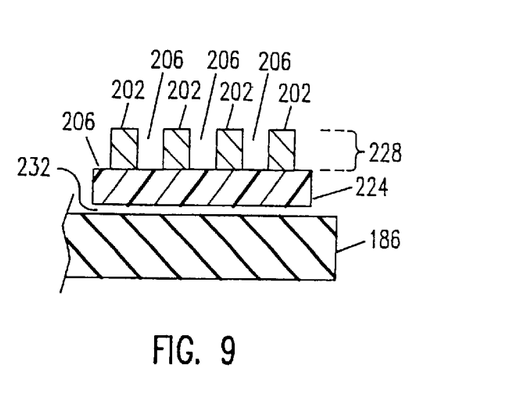
FIG. 9 is a cross-sectional view of the head gimbal assembly taken along the line 9—9 of FIG. 7.

FIG. 9 is a cross-sectional view illustrating that where the electrical lines 202 cross the slider 186, the first layer 220 has been completely removed from underneath the second layer 224 leaving only the layers 224 and 228. A space 232 separates the slider 186 from the second layer 224, thereby allowing the slider 186 to gimbal (move) more or less unrestricted from the electrical lines 202.

Figure 10:
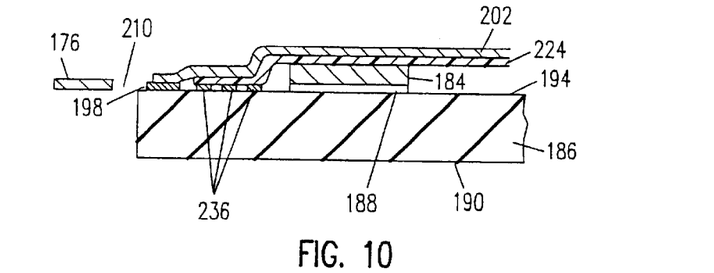
FIG. 10 is a cross-sectional view of the head gimbal assembly taken along the line 10—10 of FIG. 7.

FIG. 10 is a cross-sectional view illustrating that the electrical lines 202 and the second layer 224 are positioned on a first side of the tab 184. The tab 184 supports the electrical lines 202 and the second layer 224 and provides strain relief for the electrical lines 202. The layer of epoxy 188 is positioned on a second side of the tab 184 for bonding the slider 186 to the tab 184.

Each electrical line 202 is bonded to one of the termination pads 198, preferably by ultrasonic bonding. The termination pads 198 are regions where a plurality of electrical leads 236 terminate on the backside surface 194, with each electrical lead 236 terminating in one of the pads 198. The electrical leads 236 provide electrical connection to the transducers on the slider 186.

As can be seen in FIG. 10, the second layer 224 is positioned between the electrical leads 236 and the electrical lines 202, thereby preventing the electrical lines 202 from shorting the leads 236.

The construction and use of the HGA 170 is analogous to the construction and use of the suspension 10 shown in FIG. 3, and the HGA 170 can be substituted for the suspensions 10 or 14 in the disk file 84 shown in FIG. 5. Specifically, the slider portion 182 is analogous to the slider portion 54 and the load beam 174 is analogous to the link portion 62. In use, the load beam 174 includes an arm portion (not shown) analogous to the arm portion 58. The slider 186 includes one or more data transducers for reading and/or writing data on a magnetic medium. However, with the HGA 170, the electrical lines 202 extend along the side of the load beam 174 that faces away from the disk 88 (shown in FIG. 5) on which the slider 186 is reading or writing data.

The flexures 176 and 178 are regions of reduced stiffness (compared to the load beam 174) that separate the slider portion 182 from the load beam 174 and which function to allow the slider 186 to conform to, and fly over, the recording disk 88 (shown in FIG. 5).

In the preferred embodiment, the HGA 170 is manufactured from a laminated material such as the multilayered laminate 39 shown in FIG. 2. Photolithography and chemical etching are then used to form the various features of the HGA 170, such as the electrical lines 202, the flexures 176 and 178 and the space 210. This manufacturing process eliminates the need to add discrete twisted pair read/write cables to the HGA 170 by hand.

Figure 11:
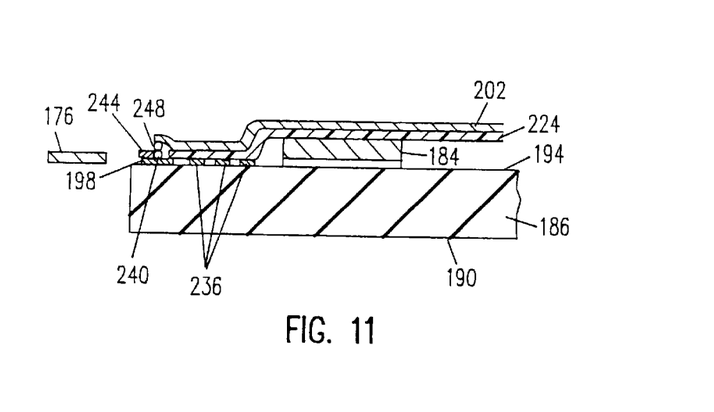
FIG. 11 is a cross-sectional view of an alternative embodiment of the head gimbal assembly shown in FIG. 10.

FIG. 11 is an alternative embodiment showing the electrical lines 202 attached to the electrical leads 236 by a soldering techniques similar to the techniques disclosed in U.S. Pat. Nos. 4,761,699 or 4,789,914. In this alternative embodiment, a solder ball 240 is added to each termination pad 198. The second layer 224 is extended over the termination pads 198 and an aperture 244 is etched through the second layer 224. A solder ball 248 on the electrical line 202 is then reflowed to the solder ball 240 through the aperture 244 using a laser or a hot tip to melt the solder. Preferably, the solder balls 240 and 248 comprise tin-lead (SnPb) or tin-bismuth ((SnBi) eutectic solder, but other types of solder can be used.

Referring now to FIGS. 1 and 2, the utility of the laminated structure 39 can be explained. The trend within the hard disk drive industry towards smaller drives has created a demand for very small (and low cost) head gimbal assemblies. The laminated structure of the transducer suspension 10 permits very small head gimbal assemblies to be designed especially when the third layer 48 is comprised of a high strength electrical conductor.

The three layers of the suspension 10 function as follows: The first layer 40 (or 162) is a stiffener layer that gives rigidity to the system 10. The second layer 44 (or 164) is comprised of a dielectric material that functions as an electrical insulator between the first layer 40 (or 162) and the third layer 48 (or 166). For some applications, it is useful if the second layer 44 (or 164) is a dielectric material that also has viscoelastic properties (like a polyimide) which increases damping. Viscoelastic means that the stress in a deformed material is proportional to both the deformation and the rate of deformation. Viscoelastic materials also exhibit creep and relaxation behavior. Creep means that under constant stress the deformation increases in time. Relaxation means that under constant fixed deformation the stress decreases steadily in time.

The third layer 48 (or 166) is comprised of a high strength electrically conducting material, such as one of the high strength copper alloys described previously. The third layer 48 (or 166) is preferably comprised of a high conductivity alloy (e.g. a copper alloy) because the electrical lines 66 (or 154) need to function as efficient electrical conductors.

The use of high strength alloys in the third layer 48 (or 166) is important for several reasons: First, the use of a high strength alloy in the conductor layer reduces the stiffness of the suspension 10 (or 130) which is important when the slider 22 (or 152) is small (See Example 2 below).

Second, the use of a high strength alloy permits the thickness of the third layer 48 (or 166) to be kept less than or equal to eighteen microns (as shown in Example 1 below, thickness varies inversely with the square root of yield strength).

Third, the use of a high strength alloy permits more design options such as the integration of the electrical lines 66 (or 154) and the hinges 78 directly into the third layer 48 (or 166). Similarly, the use of a high strength alloy permits the use of the flexures 134 and 138, because the third layer 166 carries most of the load once the first layer 162 has been removed.

Fourth, the high strength copper alloy adds robustness to the suspension and reduces yield losses due to handling damage during the manufacturing process.

EXAMPLE 1

The reason use of a high strength alloy reduces the thickness of the third layer 48 (or 166) is illustrated by the following discussion:

The thickness "t" of a rectangular metal strip having a width "w" and a length "L" is related to the yield strength of the material "$S_y$" by equation 1:

$$t = C/S_Y \qquad (1)$$

where C=constant=$(6PL/w)^{1/2}$ and P is the load applied to the metal strip to cause it to bend.

The following calculation uses Equation 1 to illustrate that if the metal strip must carry the same load (P) and is comprised of a second material having a yield strength which is three times greater than the yield strength of a first material, then the metal strip comprised of the second material can be 42% thinner and still have the same strength: If $S_{y1}$=soft copper yield strength=30 ksi; and $S_{y2}$=high strength copper alloy yield strength=90 ksi; then $t_2/t_1=(S_{y1}/S_{y2})^{1/2}$=0.58 (a 42% reduction in thickness).

EXAMPLE 2

The reason use of a high strength alloy reduces the stiffness of the third layer 48 (or 166) is illustrated by the following discussion:

The stiffness "k" of a rectangular metal strip having a width "w" and length "L" is related to the thickness "t" of the material by equation 2:

$$k = Dt^3 \qquad (2)$$

where D=constant=$Ew/6L^3$ and E is Young's modulus.

The following calculation uses Equation 2 and the result of Example 1 to illustrate that if the metal strip must carry the same load (P) and is comprised of a second material having a yield strength which is three times greater than a first material, then the metal strip comprised of the second material has an 81% reduction in stiffness: If $S_{y1}$=soft copper yield strength=30 ksi; and $S_{y2}$=high strength copper alloy yield strength=90 ksi; then $k_2/k_1=(t_2/t_1)^3=(0.58)_3$=0.19 (an 81% reduction in stiffness).

Figure 12:
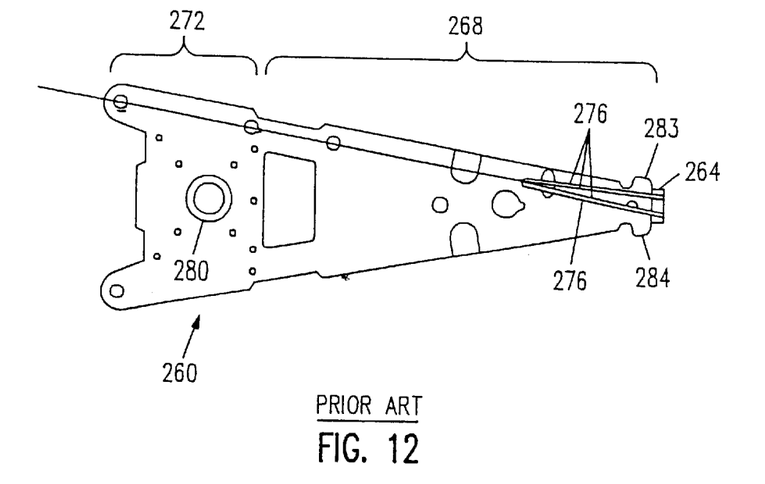
FIG. 12 is a top view of a head gimbal assembly according to the prior art.

FIG. 12 illustrates a head gimbal assembly 260 (HGA 260) of the type used in the prior art. The HGA 260 comprises a slider 264, a load beam 268, an arm portion 272 and a plurality of electrical wires 276. The electrical wires 276 are discrete wires which are routed over the back of the slider 264 and are tacked in place with epoxy. The resulting epoxy "bump" takes up space in the vertical direction (called "z-height") and limits how closely a pair of magnetic disks can be stacked adjacent to each other in the disk file.

A swage joint 280 connects the arm portion 272 to an actuator arm, such as the arm 18 illustrated in FIG. 5. A region 284 and a region 288 indicate portions of the load beam 268 which extend beyond the slider 264, thereby taking up disk area at the ID track of the magnetic disk.

Figure 13:
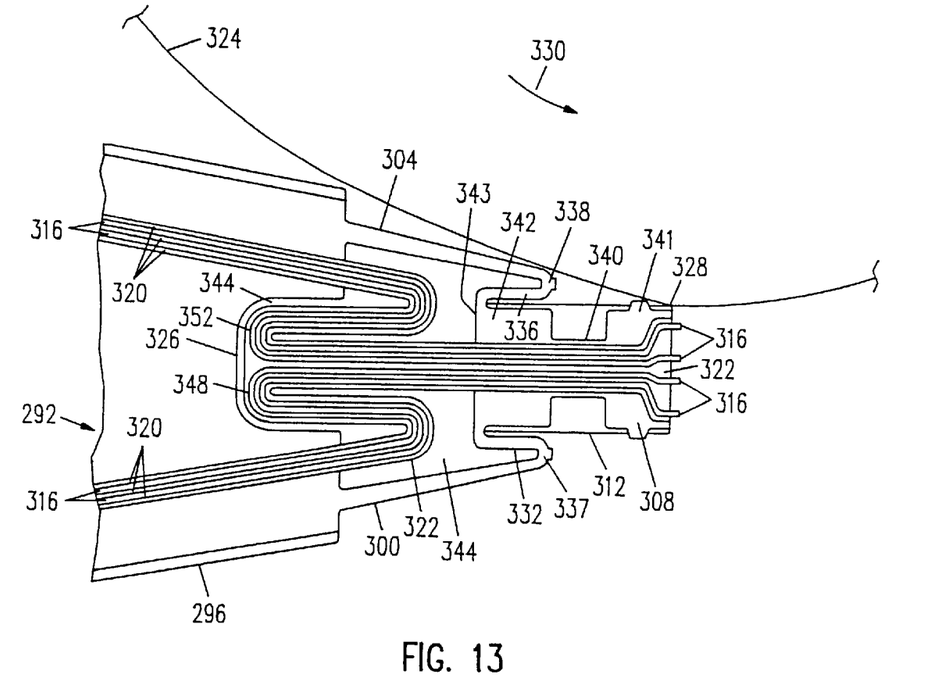
FIG. 13 is a top view of a head gimbal assembly according to the present invention.

FIG. 13 illustrates a head gimbal assembly 292 (HGA 292) according to the present invention. The HGA 292 comprises a load beam 296, a flexure arm 300, a flexure arm 304, a slider portion 308, a slider 312 and a plurality of electrical lines 316. A plurality of spaces 320 are positioned adjacent to each side of the electrical lines 316 to prevent the electrical lines 316 from contacting each other or other electrically conductive material. The electrical lines 316 are positioned on a dielectric layer 322 that prevents the electrical lines from contacting other electrically conductive materials.

In the preferred embodiment, the load beam 296 is elongated, like the load beam 268 of the HGA 260, and the HGA 292 includes an arm portion, like the arm portion 272 shown in FIG. 12, for connecting the load beam 296 to an actuator arm. The load beam 296 includes an end 326.

The load beam 296 and flexure arm 304 are contoured to fit tightly against a disk spacer 324 such that the HGA 292 contacts the spacer ring 324 at a corner 328 of the slider 312. The spacer ring 324 is the portion of the spindle hub 92 that separates the disks 88 in FIG. 5. An arrow 330 indicates the direction of rotation of the spacer ring 324 (and the attached magnetic disk).

The slider portion 308 and flexure arm 304 are contoured so that the HGA 292 does not take up additional disk space at the disk ID track. This allows more data tracks on the disk to be utilized for storing data. Typically, the design of the HGA 292 allows side clearances between the slider corner 328 and the read/write-element as low as 0.45 mm to 0.80 mm., depending on the slider size and read/write element location.

The flexure arm 300 includes a beam portion 332 which is oriented approximately parallel to the longitudinal axis of the flexure arm 300 but rests in the same plane as the flexure arm 300. Similarly, the flexure arm 304 includes a beam portion 336 which is oriented approximately parallel to the longitudinal axis of the flexure arm 304 but rests in the same plane as the flexure arm 304. The length of the beam portions 332 and 336 can be sized to ensure that the slider 312 translates (without pitch and roll rotation) when the load 402 (shown in FIG. 17) is applied.

In the preferred embodiment, the beam portion 332 is a continuous part of the flexure arm 300 that is connected to the flexure arm 300 by a unshaped curve section 337. Similarly, the beam portion 336 is a continuous part of the flexure arm 304 that is connected to the flexure arm 304 by a unshaped curve section 338.

The slider portion 308 is an "I-shaped" member that includes a longitudinal section 340 and two cross members 341 and 342. The beam portions 332 and 336 intersect the cross member 342 near an edge 343 of the cross member 342. An opening 344 is formed in the region bounded by the end 326, the flexure arms 300 and 304, the beam portions 332 and 336 and the edge 343.

The electrical lines 316 extend over the longitudinal section 340, the cross member 342 and across the opening 344. An "S-shaped" loop 348 is formed by some of the electrical lines 316 in the opening 344 near the end 326. Similarly, a reverse "S-shaped" loop 352 is formed by some of the electrical lines 316 in the opening 344 near the end 326. The purpose of the loops 348 and 352 is to create some "play" in the electrical lines 316 so as to minimize the contribution of the electrical lines 316 to the pitch and roll stiffness of the HGA 292.

Figures 14, 15, 16:
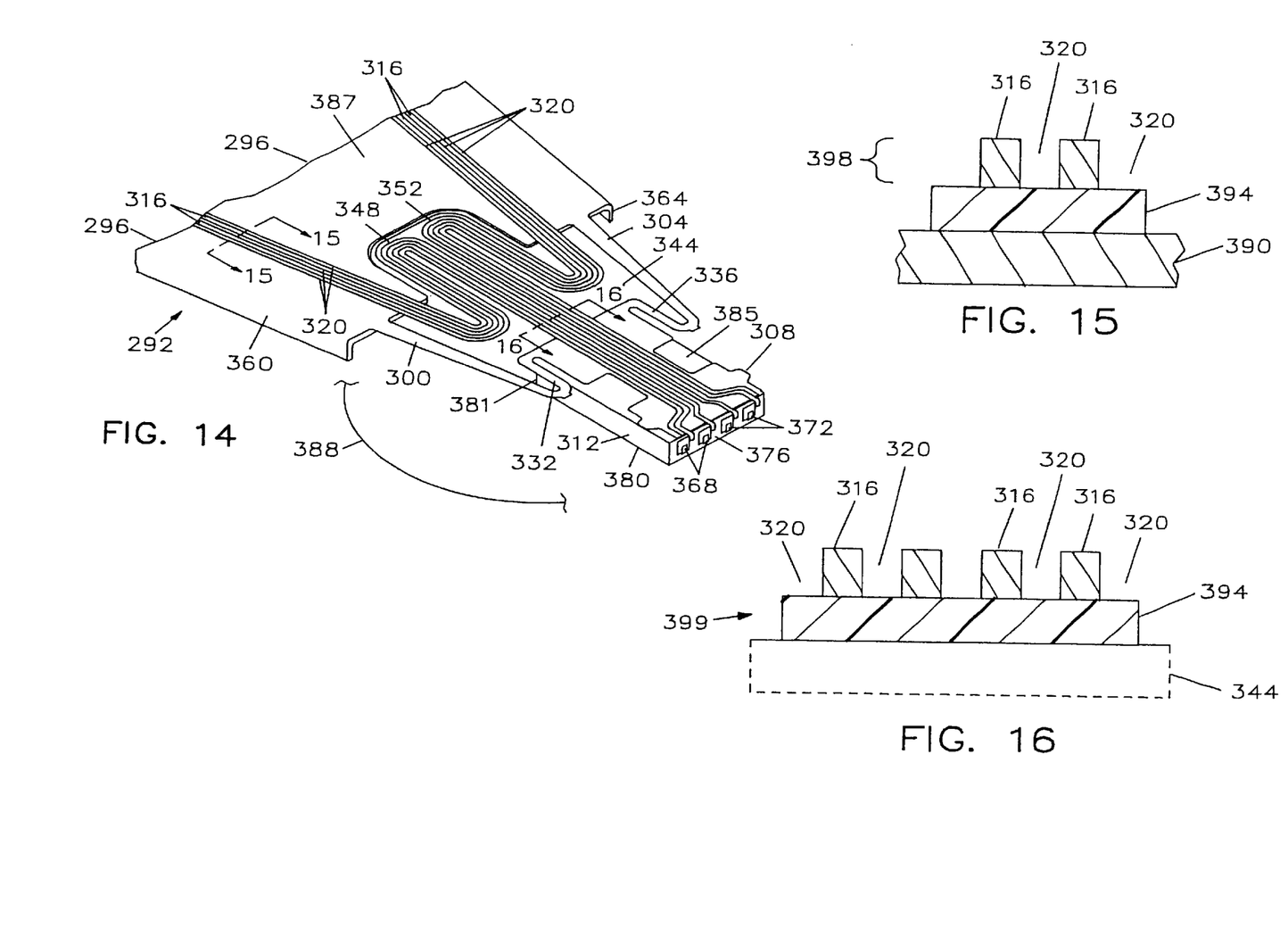
FIG. 14 is an isometric view of the head gimbal assembly shown in FIG. 13.
FIG. 15 is a cross-sectional view of the head gimbal assembly taken along the line 15—15 of FIG. 14.
FIG. 16 is a cross-sectional view of the head gimbal assembly taken along the line 16—16 of FIG. 14.

FIG. 14 is an isometric view of the HGA 292 illustrating that the edges of the load beam 296 are curved downwards (i.e. in the direction away from the electrical lines 316) to form a stiffening flange 360 and a stiffening flange 364. The downward curl of the flanges 360 and 364 means that they do not require additional z height.

FIG. 14 also illustrates that a pair of read termination pads 368 and a pair of write termination pads 372 are located on a trailing edge 376 of the slider 312. One electrical line 316 is attached to each termination pad 368 and to each termination pad 372, preferably by ultrasonic bonding. The slider 312 is a conventional magnetoresistive slider having an air bearing surface 380, a leading edge 381 and a backside surface 385 positioned opposite to the airbearing surface 380. The slider 312 also includes one or more data transducers for reading and/or writing data on a magnetic medium, and these are usually positioned on the trailing edge 376.

The load beam 296 has a backside surface 387 that faces away from a disk 388 on which the slider 312 is reading and/or writing data.

FIG. 15 is a cross-sectional view of the HGA 292 illustrating that where the electrical lines 316 overlap the load beam 296, the HGA 292 is a multilayered structure comprised of a first layer 390 analogous to the first layer 40, a second layer 394 analogous to the second layer 44 and a third layer 398 analogous to the third layer 48. The dimensions and compositions of the layers 390, 394 and 398 are identical to those previously described for the layers 40, 44 and 48 with respect to FIG. 2. However, in the HGA 292, the layers 390, 394 and 398 are oriented so that the third layer 398 is facing away from the air bearing surface 380. The second layer 394 is positioned between the slider support portion 308 and the third layer 398.

FIG. 15 also illustrates that the electrical lines 316 are regions of the third layer 398 that are roughly rectangular in cross section, and that are separated from each adjacent electrical line 398 by one of the spaces 320. The spaces 320 extend down to the second layer 394 so that the second layer 394 is exposed through the space 320. One of the spaces 320 is positioned along each side of an electrical line 316 so as to prevent the electrical line 316 from shorting with an adjacent electrical line 316. The electrical lines 316 are formed in the same manner as was previously described for the electrical lines 66.

FIG. 16 is a cross-sectional view illustrating that where the electrical lines 316 cross the opening 344, the first layer 390 has been completely removed from underneath the second layer 394 leaving only the layers 394 and 398. The combination of the electrical lines 316 and the second layer 394 is referred to as an integrated electrical cable 399.

In the preferred embodiment, the HGA 292 is manufactured from a laminated material such as the multilayered laminate 39 shown in FIG. 2. Photolithography and chemical etching are then used to form the various features of the HGA 292, such as the electrical lines 316, the flexure arms 300 and 304 and the opening 344.

Figure 17:
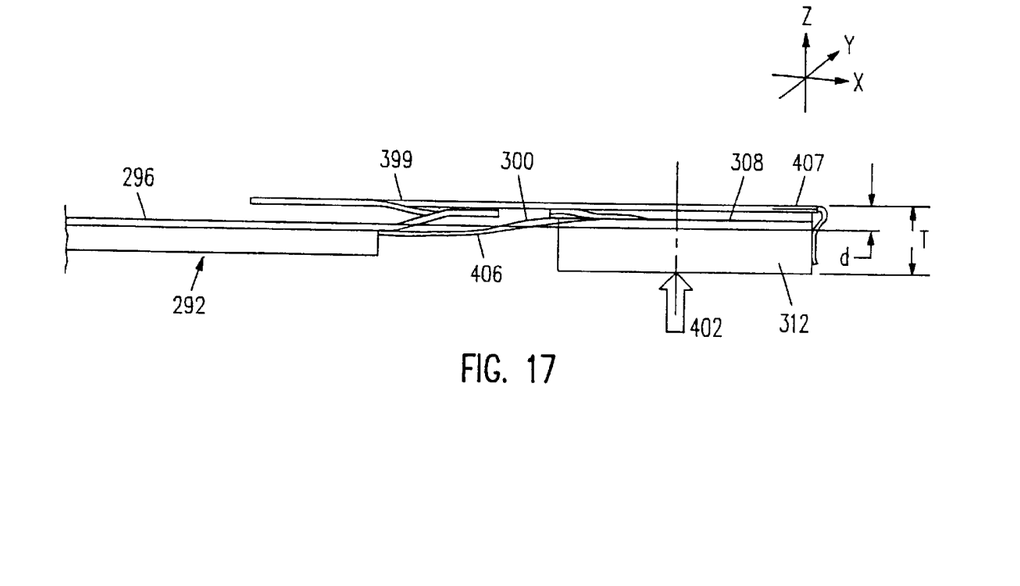
FIG. 17 is a side view of the head gimbal assembly shown in FIG. 13.

FIG. 17 is a side view of the HGA 292 illustrating that the deflection "d" due to the load "L" takes place in the space "T" between the disk 388 (shown in FIG. 14) and a back surface 407 of the HGA 292, and does not require additional z-height. Z-height is defined as height in the direction "z" illustrated by the coordinate system shown in FIG. 17. The load "L" is a force applied in the direction indicated by the arrow 402 which arises from a preformed area near the arm attach area of the load beam 296.

The design of the HGA 292 is chosen so that the total z-height of the HGA 292 is equal to thickness of the slider 312 plus the thickness of the load beam 296 and the layer of epoxy that bonds the slider 312 to the slider portion 308, plus the thickness of the electrical cable 399 positioned on top of the slider portion 308. In the preferred embodiment, the total z-height of the HGA 292 is less than or equal to 1.3. mm. The thickness of the electrical cable 399 is less than or equal to 0.035 mm. Typically, the design of the HGA 292 allows the disks 88 (shown in FIG. 5) to be spaced 1.0 mm to 1.3 mm apart, depending on the size of the slider 312.

FIG. 17 also shows that a region 406 of the flexure arm 300 has a thickness which is less than the thickness of the load beam 296. The flexure arm 304 has a similar thickness to the flexure arm 300. The flexure arms 300 and 304 are regions of reduced stiffness (compared to the load beam 296) that separate the slider portion 308 from the load beam 296 and which function to allow the slider 312 to conform to, and fly over, a magnetic disk (like the recording disk 88 shown in FIG. 5). The flexure arms 300 and 304 are comprised entirely of the first layer 390 and form continuous extensions of the load beam 296.

Figure 18:
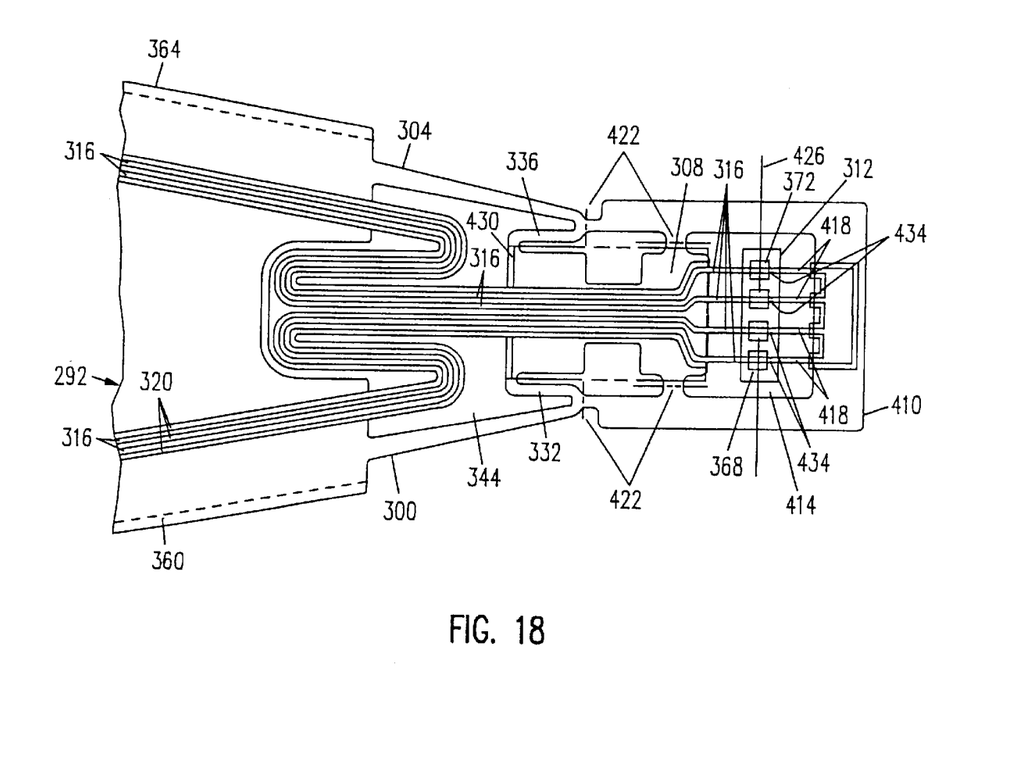
FIG. 18 is a top view of a frame used in manufacturing a head gimbal assembly according to the present invention.

FIG. 18 illustrates a frame 410 used in manufacturing the HGA 292. The frame 410 is formed as an extension of the HGA 292 when the laminated material, such as the multilayered laminate 39 shown in FIG. 2, is etched to yield the HGA 292. The frame 410 abuts the slider portion 308 and the flexure arms 300 and 304 at the shear lines 422. All of the elements of the HGA 292 shown in FIGS. 13 and 14 are formed approximately simultaneously with the frame 410, including the load beam 296, the flexure arms 300 and 304 the slider portion 308, the plurality of electrical lines 316, the plurality of spaces 320, the slider portion 308 and the beam portions 332 and 336. The slider 312 is not part of the frame 410, but is attached later as is explained below.

The frame 410 also includes an aperture 414, a plurality of electrical line extensions 418 and a plurality of shear lines 422. The slider 312 is positioned at a ninety degree angle to the frame 410 with the termination pads 368 and 372 positioned along a line 426 and underneath the electrical lines 316.

An ultrasonic bonding head is then positioned above the termination pads 368 and 372 with the electrical lines 316 between the ultrasonic bonding head and the termination pads 368 and 372, and the electrical lines 316 are ultrasonically bonded to the termination pads 368 and 372. In the preferred embodiment, the electrical lines 316 are plated with gold before the bonding process takes place, in order to facilitate the ultrasonic bonding process.

After the electrical lines 316 are ultrasonically bonded to the termination pads 368 and 372, the frame 410 is sheared away from the HGA 292 at the shear lines 422. The HGA 292 is then rotated ninety degrees while holding the slider 312 fixed so that the slider 312 becomes positioned in a position 430 indicated by phantom lines in FIG. 18. Alternatively, the slider 312 could be rotated into the position 430 while holding the HGA 292 fixed. When the HGA 292 is rotated, the extensions 418 break off at a plurality of break points 434, thereby completely freeing the HGA 292 from the frame 410. The slider 312 is then bonded to the slider portion 308 with epoxy to secure it to the HGA 292.

Figure 19:
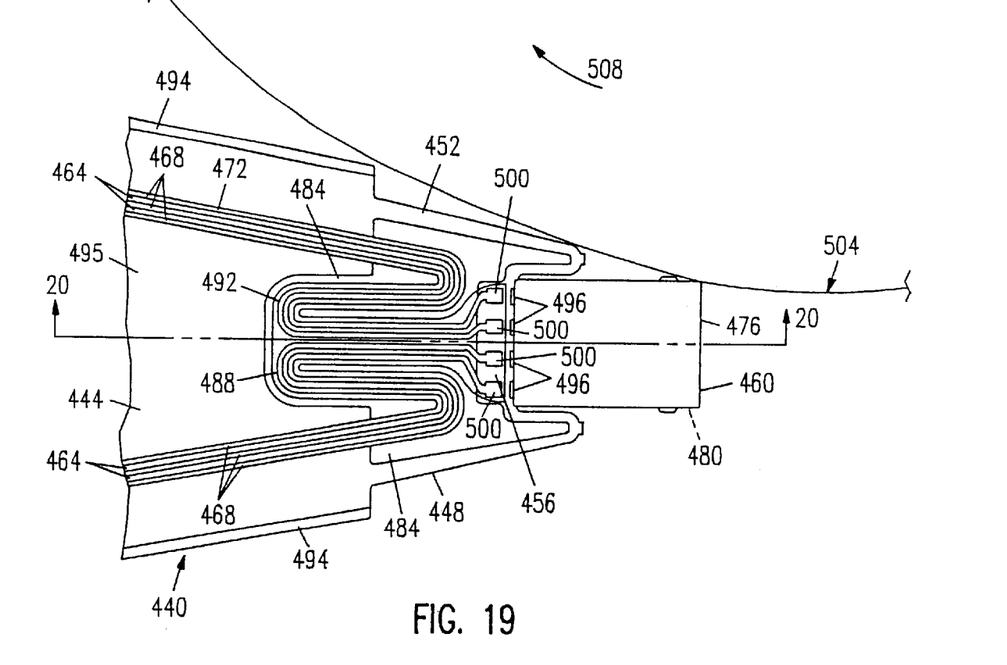
FIG. 19 is a top view of an alternative embodiment of a head gimbal assembly according to the present invention.

FIG. 19 is an alternative embodiment of the present invention illustrating a head gimbal assembly 440 (HGA 440). The HGA 440 comprises a load beam 444, a flexure arm 448, a flexure arm 452, a slider portion 456, a slider 460 and a plurality of electrical lines 464. A plurality of spaces 468 are positioned adjacent to each side of the electrical lines 464 to prevent the electrical lines 464 from contacting each other or other electrically conductive material. The electrical lines 464 are positioned on a dielectric layer 472 that prevents the electrical lines from contacting other electrically conductive materials.

In the preferred embodiment, the load beam 444 is elongated, like the load beam 268 of the HGA 260, and the HGA 440 includes an arm portion, like the arm portion 272 shown in FIG. 12, for connecting the load beam 444 to an actuator arm. The slider 460 is similar to the slider 312 and has an air bearing surface 476 and a backside surface 480. The electrical lines 464 run across a space 484 and include a pair of s-shaped loops 488 and 492 (other shapes are possible). A stiffening flange 494 is positioned along each edge of the load beam 444. The load beam 444 has a frontside surface 495 which faces in the same direction as the airbearing surface 476. The dielectric layer 472 is positioned on the frontside surface 495.

The shape and composition of the HGA 440 is similar to the shape and composition of the HGA 292, except as follows: The slider 460 is mounted on the opposite side of the HGA 440 as compared to the HGA 292, so that the airbearing surface 476 is on the same side of the HGA 440 as the electrical lines 464. Additionally, in the HGA 440, the slider 460 is rotated 180 degrees so that a plurality of termination pads 496 are positioned proximally to the solder bumps 500 on the electrical lines 464.

Since the electrical lines 464 do not have to extend over the slider 460, the electrical lines 464 can be attached to the termination pads 496 by a plurality of solder bumps 500, for example by using the soldering technique disclosed in U.S. Pat. No. 4,761,699. Because of the orientation of the slider 460, a magnetic disk 504 rotates in the direction of an arrow 508, which is opposite to the rotation shown in FIG. 13 by the arrow 330.

Figure 20:
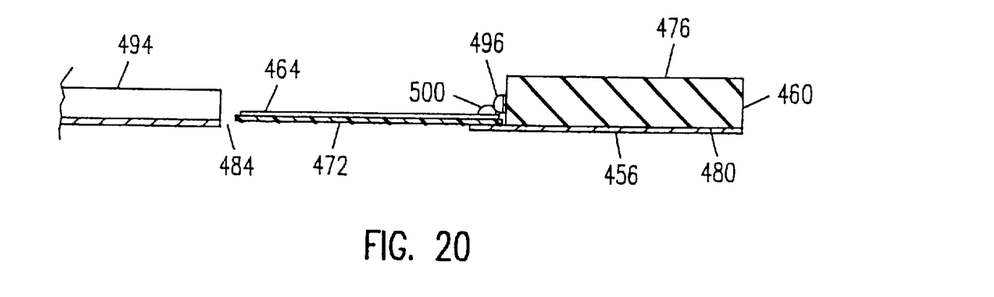
FIG. 20 is a cross-sectional view of the head gimbal assembly taken along the line 20—20 of FIG. 19.

FIG. 20 is a cross-sectional view of the HGA 440 illustrating that the dielectric layer 472 is positioned between the electrical lines 464 and the space 484 and slider portion 456. The electrical lines 464 and the spaces 468 have the same shapes and compositions as was described previously for the electrical lines 316 and the spaces 320 shown in FIGS. 15 and 16.

FIG. 20 also illustrates that the slider 460 is bonded to the slider portion 456 (preferably with epoxy) and that the flange 494 is bent upward (in the direction of the air bearing surface 476) to minimize z-height. The HGA 440 exhibits the same reduced z-height and side space clearance as was described previously with respect to the HGA 292.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for forming a head gimbal assembly comprising the steps of:
   a. forming the head gimbal assembly and a frame from a continuous portion of a laminated material comprised of a first layer, a second layer comprised of a dielectric material, and a third layer comprised of an electrically conductive material, the head gimbal assembly including a plurality of electrical lines formed by the third layer, the frame being a part of the head gimbal assembly and including a plurality of electrical line extensions that are formed by the third layer and that abut the plurality of electrical lines;
   b. positioning a slider having a plurality of termination pads at an angle to the frame, with the plurality of termination pads being positioned adjacent to the plurality of electrical lines;
   c. bonding the plurality of termination pads on the slider to the plurality of electrical lines;
   d. partially separating the frame from the head gimbal assembly; and
   e. changing a relative position of the slider to the head gimbal assembly by an amount sufficient to separate the plurality of electrical lines from the plurality of electrical line extensions.

2. The method of claim 1 wherein the third layer has a thickness less than or equal to eighteen microns.

3. The method of claim 1 wherein the third layer comprises an electrically conductive material selected from the group consisting of Cu—Ni—Si—Mg alloy, Be—Cu—Ni alloy, Cu—Fe—Zn—P alloy and Cu—Ti alloy.

4. The method of claim 1 wherein the second layer comprises a polyimide.

5. The method of claim 1 wherein the first layer comprises stainless steel.

* * * * *